United States Patent
Heinrich et al.

(10) Patent No.: US 12,069,802 B2
(45) Date of Patent: Aug. 20, 2024

(54) PRE-PLATING OF SOLDER LAYER ON SOLDERABLE ELEMENTS FOR DIFFUSION SOLDERING

(71) Applicant: Infineon Technologies AG, Neubiberg (DE)

(72) Inventors: Alexander Heinrich, Bad Abbach (DE); Alexander Roth, Zeitlarn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/987,790

(22) Filed: Aug. 7, 2020

(65) Prior Publication Data
US 2022/0046792 A1 Feb. 10, 2022

(51) Int. Cl.
*H05K 1/02* (2006.01)
*H05K 1/09* (2006.01)
*H05K 3/34* (2006.01)

(52) U.S. Cl.
CPC ............ *H05K 1/0296* (2013.01); *H05K 1/09* (2013.01); *H05K 3/3452* (2013.01); *H05K 3/3473* (2013.01); *H05K 3/3478* (2013.01)

(58) Field of Classification Search
CPC ...... H05K 1/02; H05K 3/3478; H05K 3/3473; H05K 3/3452; H05K 1/09; H05K 1/0296
USPC .......................................................... 174/250
See application file for complete search history.

(56) References Cited

U.S. PATENT DOCUMENTS

| | | | |
|---|---|---|---|
| 9,793,232 B1* | 10/2017 | Arvin | H01L 24/13 |
| 2008/0230905 A1 | 9/2008 | Guth et al. | |
| 2012/0018872 A1* | 1/2012 | Ahmad | H05K 1/141 |
| | | | 438/106 |
| 2013/0200532 A1 | 8/2013 | Otremba et al. | |
| 2020/0211995 A1 | 7/2020 | Jacobs | |
| 2021/0242119 A1* | 8/2021 | Ho | H01L 23/49822 |

FOREIGN PATENT DOCUMENTS

| | | |
|---|---|---|
| CN | 1155968 A | 7/1997 |
| CN | 1473089 A | 2/2004 |
| CN | 103026476 A | 4/2013 |
| CN | 103247545 A | 8/2013 |
| DE | 19531158 A1 | 2/1997 |

OTHER PUBLICATIONS

Unknown, Author, "Condura® Metal Ceramic Substrates with Pre-applied Solder DPIS", https://www.heraeus.com/media/media/het/doc_het/products_and_solutions_het_documents/material_system_1/dcb_preapplied_solder_docs/DPIS_Condura_Metal_Ceramic_Substrates_with_Pre-applied_Solder.pdf, Jul. 2021, 1-4.

* cited by examiner

*Primary Examiner* — Tremesha S Willis
(74) *Attorney, Agent, or Firm* — Murphy, Bilak & Homiller, PLLC

(57) ABSTRACT

A pre-soldered circuit carrier includes a carrier having a metal die attach surface, a plated solder region on the metal die attach surface, wherein a maximum thickness of the plated solder region is at most 50 μm, the plated solder region has a lower melting point than the first bond pad, and the plated solder region forms one or more intermetallic phases with the die attach surface at a soldering temperature that is above the melting point of the plated solder region.

7 Claims, 7 Drawing Sheets

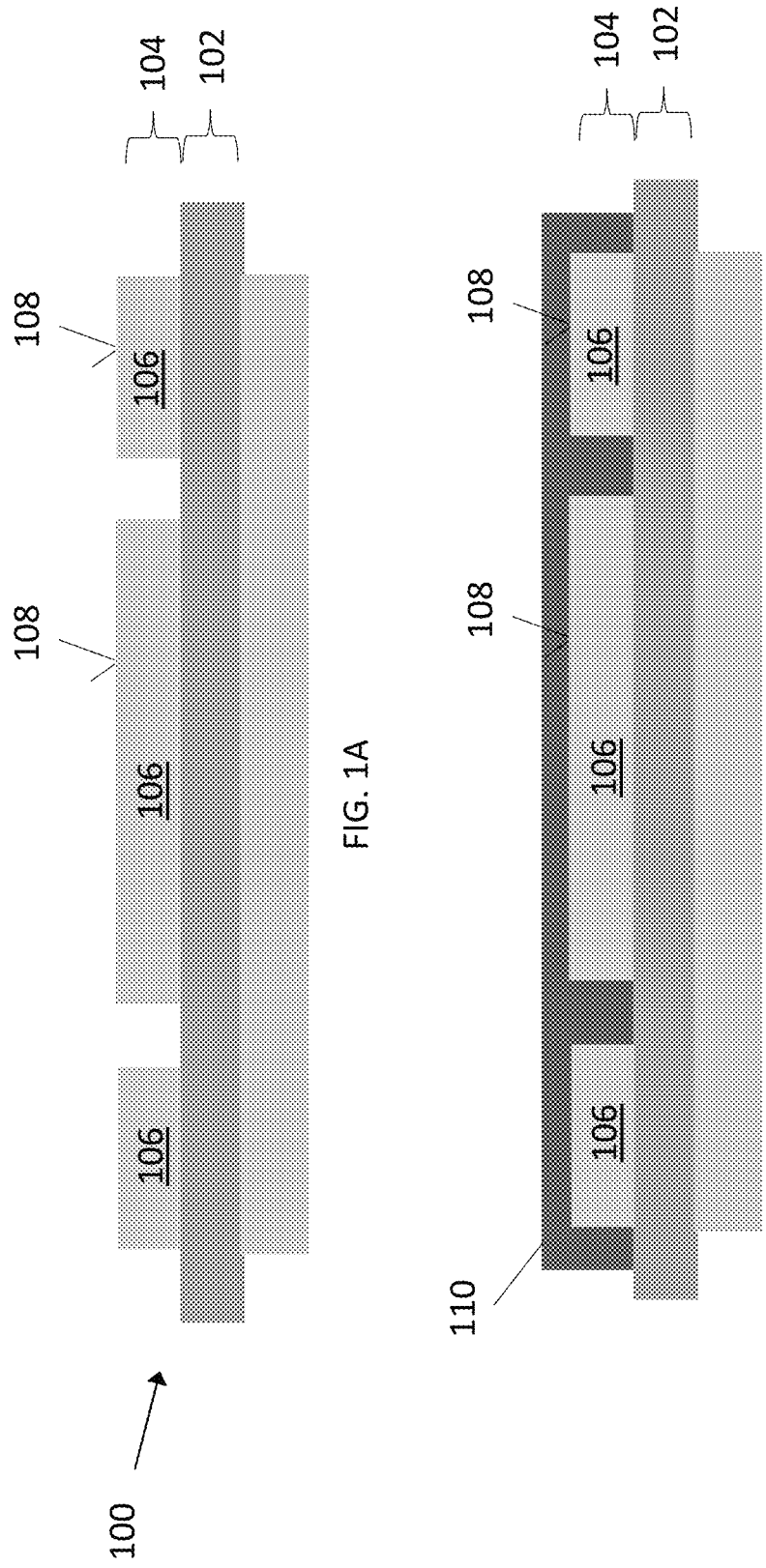

PRE-PLATING OF SOLDER LAYER ON SOLDERABLE ELEMENTS FOR DIFFUSION SOLDERING

BACKGROUND

Thermal and electrical performance play an increasing role in the advancement of semiconductor technologies. These factors, coupled with miniaturization and increased performance, demand a high-performance die (chip) attach process and material. Diffusion soldering is one such die attach process.

Diffusion soldering can be performed by sputtering a layer of solder material onto the backside of a semiconductor wafer. The deposition of the solder material represents a significant fraction of the overall wafer cost. This diffusion soldering process requires specialized equipment, including a bond force unit for applying the high force to the devices to achieve a form-fit interconnect. Furthermore, mechanical pressure is applied individually to each die and must be maintained until a significant portion of the solder has solidified isothermally, limiting the throughput of the die attach process. In addition, the soldering temperature must be high to enable a full reaction and isothermal solidification in a short time.

Thus, there is a need for improved diffusion soldering techniques.

SUMMARY

A pre-soldered circuit carrier is disclosed. According to an embodiment, the pre-soldered circuit carrier comprises carrier comprising a metal die attach surface, a plated solder region on a first bond pad from the plurality, wherein a maximum thickness of the plated solder region is at most 50 µm, wherein the plated solder region has a lower melting point than the die attach surface, and wherein the plated solder region forms one or more intermetallic phases with the die attach surface at a soldering temperature that is above the melting point of the plated solder region.

Separately or in combination, the die attach surface comprises any one of: Cu, Al, Ni, Ag, Au, Pd, Pt or any alloy thereof, and wherein the plated solder region comprises a tin based solder material.

Separately or in combination, the die attach surface comprises Cu or Cu alloy, or Al or an Al Alloy, and wherein the plated solder region comprises Sn/Ag/Cu, Sn/Ag, Sn/Ag/Sb, Sn/Sb, Sn/Cu or Au80/Sn20.

Separately or in combination, the maximum thickness of the plated solder region is at most 20 µm.

Separately or in combination, the maximum thickness of the plated solder region is between 5 µm and 15 µm.

Separately or in combination, the pre-soldered circuit carrier comprises a dielectric layer and metal layer attached to the dielectric layer, the metal layer comprising one or more bond pads, and wherein the die attach surface is from one of the one or more bond pads.

Separately or in combination, the pre-soldered circuit carrier is a leadframe comprising a die pad, and wherein the die pad comprises the die attach surface.

A method of forming a pre-soldered element is disclosed. According to an embodiment, the method comprises providing a substrate comprising a first metal joining surface, depositing a mask material on the substrate that covers the first metal joining surface, patterning the mask material to form an opening that exposes the first metal joining surface, and performing a plating process that forms a plated solder region on a portion of the first metal joining surface that is exposed by the opening, wherein the plated solder region has a lower melting point than the first metal joining surface, and wherein the plated solder region forms one or more intermetallic phases with the first metal joining surface at a soldering temperature that is above the melting point of the plated solder region.

Separately or in combination, a maximum thickness of the plated solder region is at most 50 µm.

Separately or in combination, the maximum thickness of the plated solder region is between 5 µm and 30 µm.

Separately or in combination, the plating process comprises electroless plating.

Separately or in combination, the substrate comprises a dielectric layer and a metal layer attached to the dielectric layer, the metal layer comprising one or more bond pads, and the first metal joining surface is from one of the one or more bond pads.

Separately or in combination, the metal layer comprises a plurality of the bond pads, depositing the mask material comprises covering the planar bond pads and filling gaps between the bond pads with the mask material, and patterning the mask material comprises forming the opening to partially expose an upper surface area of a first one of the planar bond pads.

Separately or in combination, the substrate is a leadframe or a metal clip, and the first metal joining surface is a die attach surface of the leadframe or the metal clip.

A method of soldering electronic components is disclosed. According to an embodiment, the method comprises providing a substrate comprising a first metal joining surface and a joining partner comprising a second metal joining surface, the substrate or the joining partner being pre-plated with a plated solder region, arranging the joining partner and the substrate together such that the plated solder region interfaces with the first metal joining surface and with the second metal joining surface, and performing a soldering step that forms a first soldered joint between the first and second metal joining surfaces and the plated solder region, wherein a maximum thickness of the plated solder region is at most 50 µm, and wherein the soldering step is performed at a soldering temperature that causes the plated solder region to melt and react with the first and second metal joining surfaces to form one or more intermetallic phases within the first soldered joint, each of the one or more intermetallic phases having a melting point above the plated solder region and the soldering temperature.

Separately or in combination, the substrate comprises a dielectric layer and a metal layer attached to the dielectric layer, the metal layer comprising one or more bond pads, and wherein the one or more bond pads comprise the first metal joining surface.

Separately or in combination, the substrate is pre-plated with the plated solder region.

Separately or in combination, the joining partner is pre-plated with the plated solder region.

Separately or in combination, the joining partner is a semiconductor die.

Separately or in combination, the joining partner is a passive electrical component or a mechanical connector.

Separately or in combination, the substrate is a metal clip or lead frame, the joining partner is a semiconductor die, and the first metal joining surface is a die attach surface of the leadframe or the metal clip.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A-1E, depicts selected processes steps for forming a thin pre-plated layer of diffusion solder material on a metal joining surface, according to an embodiment.

FIGS. 2A and 2B, depicts selected processes steps for diffusion soldering a semiconductor die to a metal joining surface, according to an embodiment.

DETAILED DESCRIPTION

Figure 1:
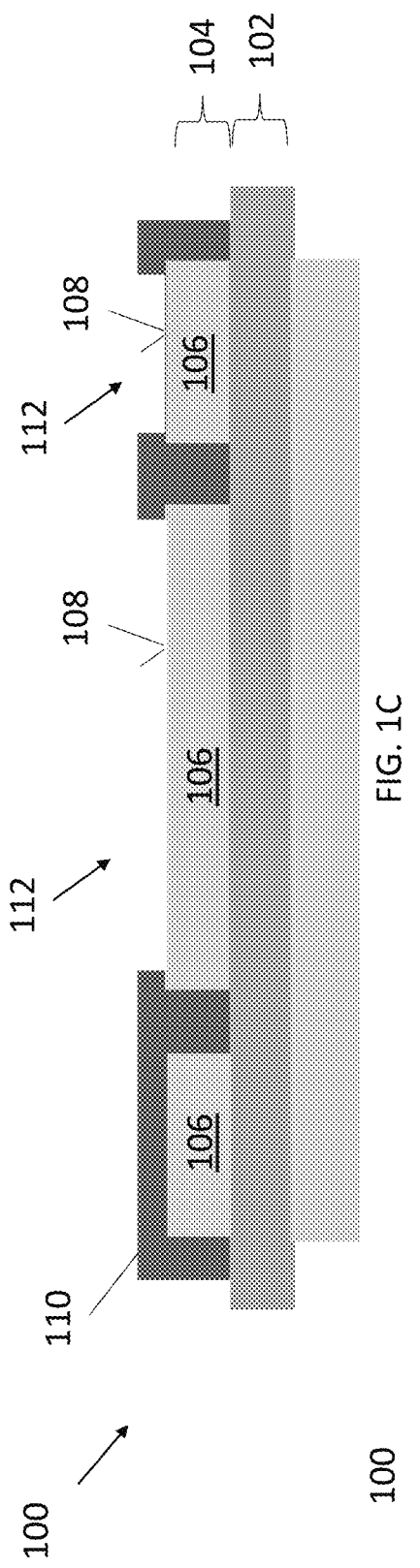
FIG. 1, which includes
Figure 1:
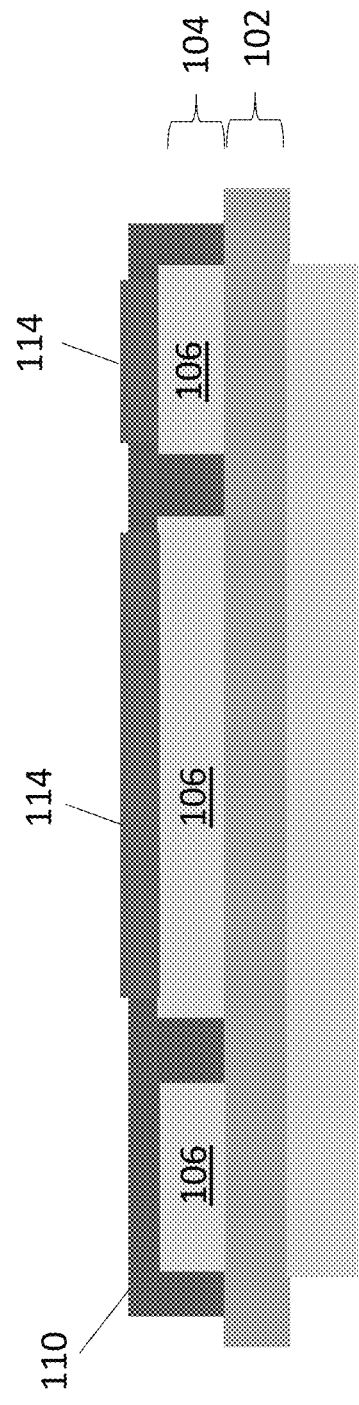
Figure 1:
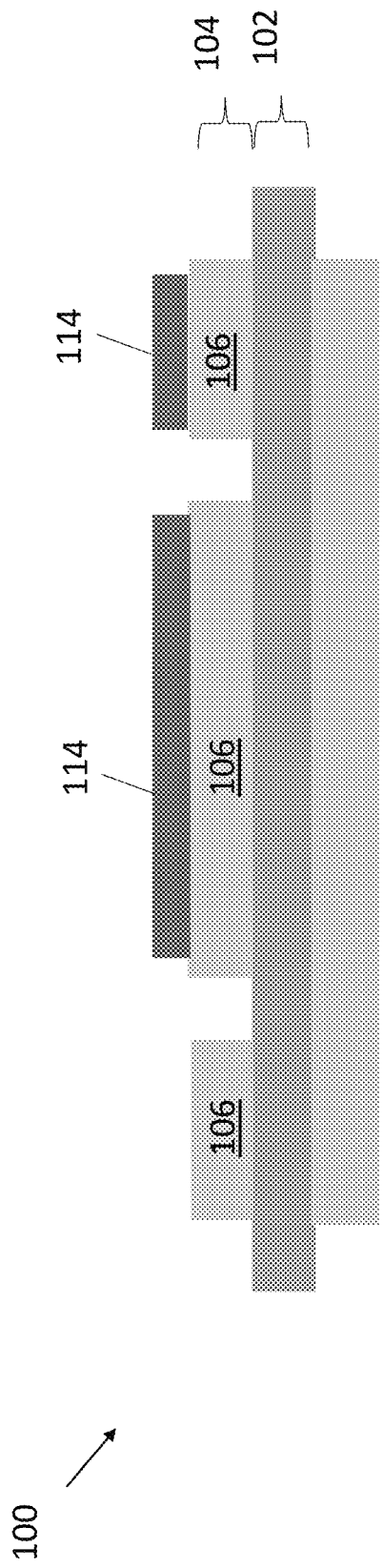

The embodiments described herein provide a technique for pre-plating a metal joining surface of a joining partner to include a thin layer of solder material. The pre-plating is done by forming a patterned mask on the metal joining surface, e.g., using a photolithography technique, and performing a metal plating process such as electroplating or electroless plating. This process forms a plated solder layer with a thickness and material composition sufficient to form a soldered joint by a pressure-free diffusion soldering technique. Advantageously, this technique is applicable to a variety of different types of joining partners. Examples of these joining partners include circuit carriers such as direct bonded copper (DBC) substrates, direct aluminium bonded (DAB) substrates, active metal brazed (AMB) substrates, insulated metal substrates (IMS), printed circuit boards (PCB), etc., semiconductor dies, passive elements such as inductors or capacitors, metal interconnect clips, heat sinks, mechanical connectors, and so forth. In each case, the pre-plated layer of solder material can be provided on these joining partners while they are stand-alone products. These stand-alone products can be soldered to another element without having to perform a dedicated solder application step, as the pre-plated layer provides the necessary solder material to perform pressure-free diffusion soldering.

Referring to FIG. 1A, a substrate 100 is provided. According to an embodiment, the substrate 100 is a circuit carrier that is configured to accommodate semiconductors dies and/or passive electrical elements. Examples of these circuit carriers include power electronics substrates such as DBC (direct bonded copper) substrates, AMB (active metal brazed) substrates, insulated metal substrates (IMS). Other examples of these circuit carriers include PCBs (printed circuit boards) and lead frame structures.

The substrate 100 may include a dielectric layer 102. Generally speaking, the dielectric layer 102 can include any of a wide variety of electrically insulating materials used in electronics applications such as ceramics, plastics, laminates, etc. In the case of a power electronics substrate 100, the dielectric layer 102 can include a ceramic material such as $Al_2O_3$ (Alumina) AlN (Aluminium Nitride), etc. In the case of a PCB, the dielectric layer 102 can include pre-peg materials (pre impregnated fibre) such as FR-2, FR-4, CEM-1, G-10, etc.

The substrate 100 includes a metal layer 104 on top of the dielectric layer 102. The metal layer 104 can be attached to the dielectric layer 102 by a variety of techniques such as oxidation, soldering, brazing, lamination, etc. The metal layer 104 is patterned into a plurality of bond pads 106. These bond pads 106 can be isolated from one another, meaning that they are formed in complete enclosed shapes from a plan-view perspective of the substrate 100 and are completely separated from one another by gaps. The bond pads 106 can be completely electrically isolated from one another, e.g., in the case of a power electronics substrate. Alternatively, at least some of the bond pads 106 can be electrically connected to one another by integrally formed conductive tracks in the substrate 100, e.g., in the case of a PCB. Generally speaking, the bond pads 106 may comprise or be plated with any or more of Cu, Ni, Ag, Au, Pd, Pt, NiV, NiP, NiNiP, NiP/Pd, Ni/Au, NiP/Pd/Au, or NiP/Pd/AuAg. In an embodiment, the bond pads 106 include regions of Cu or Cu alloy with an Ni based coating formed on the outer surfaces of the Cu or Cu alloy.

Upper surfaces of the bond pads 106 are configured as first metal joining surfaces 108. The first metal joining surfaces 108 are dimensioned from a plan-view perspective of the substrate 100 to interface and electrically connect with desired joining partner via a soldered connection. For example, the first metal joining surfaces 108 can be configured as a die attach surface that is dimensioned to accommodate one or more semiconductor dies thereon. Alternatively, the first metal joining surfaces 108 can dimensioned to accommodate one or more passive elements such as a capacitor, inductor, mechanical connector, etc.

Referring to FIG. 1B, a layer of mask material 110 is deposited on the substrate 100. The layer of mask material 110 is formed to completely cover the bond pads 106 and the gaps between these bond pads 106. As a result, each of the first metal joining surfaces 108 is covered by mask material 110. Generally speaking, the mask material 110 can be any material that is compatible with photolithographic patterning techniques. In an embodiment, the mask material 110 includes photoresist materials, e.g., photopolymeric, photo-decomposing, photocrosslinking, off-stoichiometry, polymers, etc. Alternatively, the mask material 110 can include a hardmask material which can be patterned indirectly (e.g., by etching) by a structured photoresist material.

Referring to FIG. 1C, openings 112 are formed in the mask material 110. This may be done by patterning the mask material 110 using photolithography techniques including negative and positive techniques. The openings 112 are formed to expose areal regions of the first metal joining surfaces 108. Due to the flexibility provided by photolithography, the area of the openings 112 can be dimensioned in any desired shape. In an embodiment, the openings 112 are formed to partially expose a central area of a bond pad 106 with a peripheral ring of the bond pad 106 remaining covered by the mask material 110.

Referring to FIG. 1D, a plating process is performed. The plating process selectively forms plated solder regions 114 on portions of the first metal joining surfaces 108 that are exposed by the openings 112. This plating process can be a metal plating process which uses the exposed metal as a seed surface for deposition of metal atoms thereon. During this process, the mask material 110 prevents metal from depositing on the covered surfaces. In one embodiment, the plating process is an electroplating process. According to this technique, the substrate 100 is partially or completely submerged in an aqueous based solution. A cathode that includes the desired solder material (e.g., Cu, Ni, Ag) is submerged in the aqueous based solution and a potential difference is created between the cathode and the seed surface such that the seed surface acts as an anode. Metal ions from the cathode dissolve in the solution and form the plated solder regions 114 on the seed surface. Alternatively, the plating process may be an electroless plating process. According to this technique, the substrate 100 is partially or completely submerged in a chemical bath that contains metal ions (e.g., Cu+ ions, Ni+ ions, Ag+ ions, etc.). These metal ions react with the exposed metal and form the plated solder regions 114.

The plated solder regions 114 formed by the plating process have a material composition that is suitable for a pressure-free diffusion soldering process, an example of which will be described in further detail below. To this end, the material composition of the plated solder regions 114 is such that the plated solder regions 114 have a lower melting point than the bond pads 106 and such that the plated solder region forms one or more intermetallic phases with the bond pads 106 at temperatures above the melting point of the plated solder regions 114. Exemplary material compositions for the plated solder regions 114 suitable for this requirement include Sn, Zn, In, Ga, Bi, Cd or any alloy thereof. In one specific example, the plated solder regions 114 can include tin or tin alloys such as Sn/Ag/Cu, Sn/Ag, Sn/Ag/Sb, Sn/Sb, Sn/Cu, etc., which can be used to form intermetallic phases with bond pads 106 that comprise Cu or Cu alloy and an Ni based coating. In addition, a maximum thickness of the plated solder regions 114 (i.e., the highest thickness value across an entire area of the plated solder regions 114 measured in a direction perpendicular to the first metal joining surface 108) is suitable for the pressure-free diffusion soldering process. Generally speaking, a suitable maximum thickness for the plated solder regions 114 to meet this requirement can be no greater than 50 µm, and preferably no greater than 30 µm. In the case of power semiconductor dies, the plated solder regions 114 can be formed to have a maximum thickness that is between about 20 µm and about 5 µm, specifically 15 µm, 12 µm, 10 µm, or 8 µm, for example. These thickness values allow for the formation of a soldered joint with a high concentration of intermetallic phases (e.g., at least 70% intermetallic phase ratio), which provides a soldered joint that is particularly well suited for high temperature operation.

Optionally, two separate ones of the plated solder regions 114 on a single substrate 100 can be formed to differ from one another with respect to material composition and/or thickness. This may be done by performing additional masking steps, e.g., by covering one plated solder region 114 and expose one another followed by subsequent plating processes. Additionally, or alternatively, different portions of the substrate 100 may be exposed to different plating processes and/or submerged in the plating solution for different amounts of time.

Referring to FIG. 1E, the mask material 110 is removed. This may be done using a chemical solvent, for example. As a result, the technique produces the substrate 100 to include regions of solder material (i.e., the plated solder regions 114) in the necessary soldering locations. This substrate 100 can be manufactured as a stand-alone product that is delivered with the plated solder regions 114, e.g., to a customer or other manufacturing facility. The recipient of this stand-alone product does not need to perform a solder formation step, e.g., by printing, applying a paste or applying a preformed solder on the bond pads 106, because the necessary solder material has already been formed.

Referring to FIG. 2A, semiconductor dies 116 are provided in combination with the pre-plated substrate 100. The semiconductor dies 116 include a second metal joining surface 118 that faces and contacts the plated solder regions 114. This second metal joining surface 118 can be a conductive bond pad, for example. The semiconductor dies 116 are arranged on the substrate 100 such that the plated solder regions 114 interface with the second metal joining surfaces 118, e.g., using pick and place tools. The semiconductor dies 116 may have a different size as the plated solder regions 114, as the diffusion solder process to be described below is effective regardless.

Generally speaking, the semiconductor dies 116 can have any device configuration. In an embodiment, the semiconductor dies 116 are configured as a power transistor such as a MOSFET (metal-oxide semiconductor field-effect transistor), IGBT (insulated gate bipolar transistor), HEMT (high electron mobility transistor), etc. In that case, the second metal joining surface 118 can an output terminal, e.g., source, drain, collector, emitter, etc. Alternatively, the semiconductor dies 116 may be configured as a logic die such as a gate driver, microcontroller, memory, etc., or a passive die such as an inductor or capacitor die, etc. Optionally, multiple semiconductor dies 116 with different device configurations and/or size (e.g., as shown) may be arranged on the substrate 100 simultaneously.

Referring to FIG. 2B, a diffusion soldering step that forms soldered joints between the first and second metal joining surfaces 108, 118 from the plated solder regions 114 is depicted. According to this technique, the substrate 100 and the semiconductor dies 116 are arranged in a vacuum oven 120. Formic acid 122 is then introduced into the vacuum oven. The formic acid 122 removes oxidation that may be present on the first and second metal joining surfaces 108, 118 or the plated solder regions 114. This increases the wettability of the first and second metal joining surface 108, 118, which enhances solder reflow. The temperature of the vacuum oven 120 is then increased, e.g., by a heating element under vacuum conditions, above a soldering temperature which reflows the plated solder regions 114.

The conditions of the diffusion soldering step (e.g., time and temperature) are are selected such that the plated solder regions 114 melt and react with the first and second metal joining surfaces 108, 118 to form one or more intermetallic phases within the formed soldered joints, with each of the one or more intermetallic phases having a melting point above the remaining material of the plated solder regions 114 (after soldering) and above the soldering temperature. An intermetallic phase is a chemical compound consisting of two different metals which has a different crystallographic structure as the elements it is are composed. For example, in the case of an Sn based solder material that is provided between Cu based metal surfaces, the soldered joints may include intermetallic phases of CuSn with different crystallographic properties and a higher melting point than alloyed CuSn or metallic Cu and metallic Sn.

The diffusion soldering step is performed without applying mechanical pressure, e.g., from a movable press, directly to the semiconductor dies 116. This is possible because of the very low thickness of the plated solder regions 114, e.g., no greater than 50 µm, and preferably no greater than 30 µm. At these thickness levels, high quantities of the intermetallic phases form substantially or completely throughout the thickness of the soldered joint, thereby forming a soldered joint with high tensile strength that is durable with respect to thermal expansion forces caused by high temperature operation.

Figure 2:
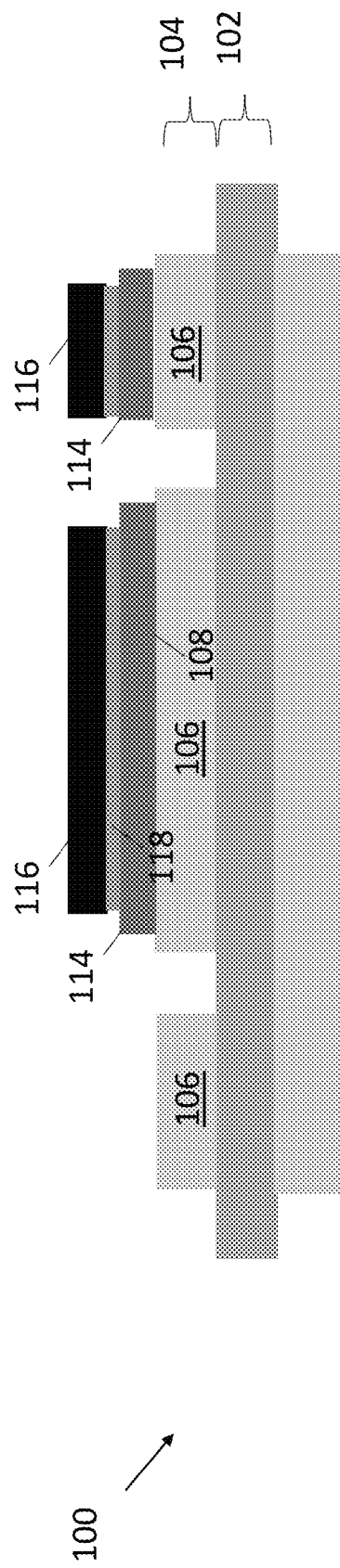
FIG. 2, which includes
Figure 2:
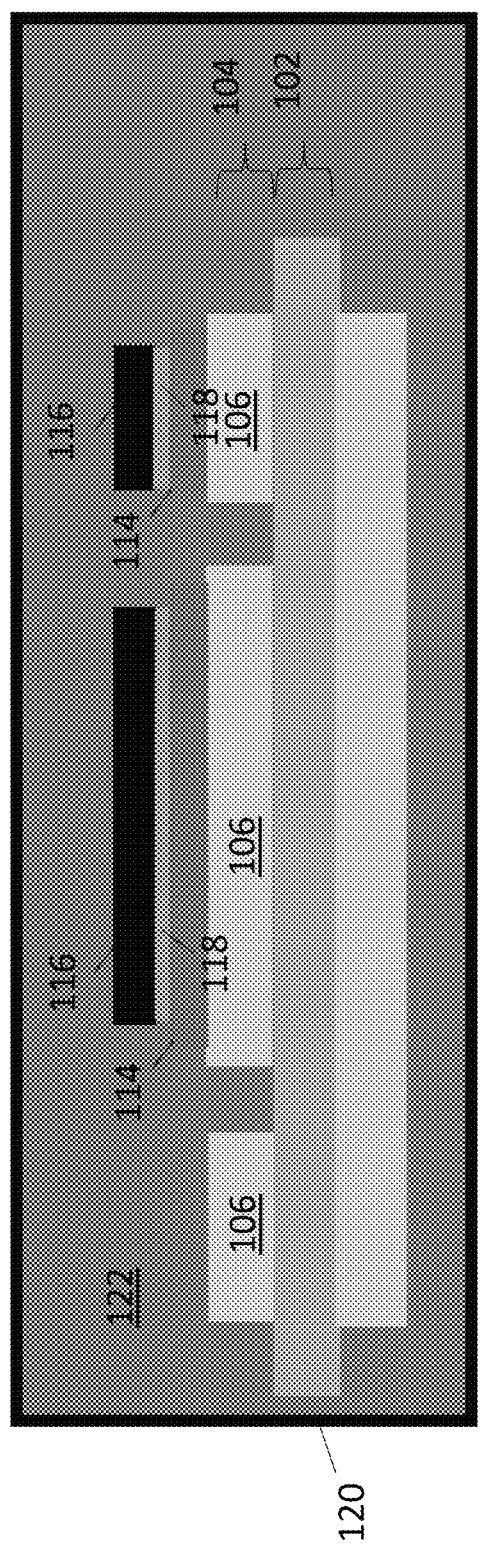
Figure 3:
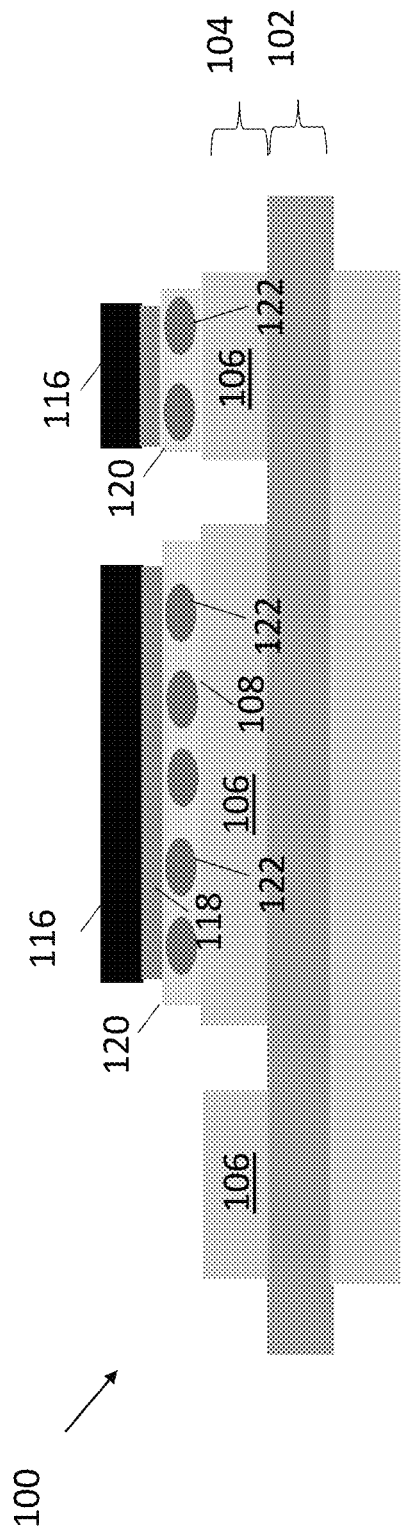
FIG. 3 illustrates an assembly with a soldered joint between a semiconductor die and a metal joining surface that includes intermetallic phases, according to an embodiment.

Referring to FIG. 3, the assembly is shown with soldered joints 120 between the first and second metal joining surfaces 108, 118 that are formed by the diffusion soldering step described with reference to FIG. 2. These soldered joints 120 have a high concentration of intermetallic phases 122 throughout most or all of the thickness of the soldered joints 120. One measure of intermetallic phase density is the intermetallic phase ratio. The intermetallic phase ratio is a ratio between the area of the intermetallic phases 122 present within the soldered joint 120 along a cross-sectional thickness of the soldered joint (e.g., as shown in FIG. 3) and the area of non-intermetallic phase containing solder material along the cross-sectional thickness of the soldered joint 120. In an embodiment, the intermetallic phase ratio of at least one of the soldered joints 120 is least 50%, and can be significantly higher, e.g., greater than 70%, 80%, 90%, etc. Another measure of intermetallic phase density is the intermetallic bridge ratio. The intermetallic bridge ratio is measured along a single line that is within the soldered joint 120 and is parallel to the first and second metal joining surfaces 108, 118. The intermetallic bridge ratio is a ratio between the length of this single line which extends through intermetallic phases 122 and the length of this single line which extends through non-intermetallic phase containing solder material. In an embodiment, the intermetallic bridge density at least one of the soldered joints 120 is at least 40%, at least 50%, at least 60%, etc.

Figure 4:
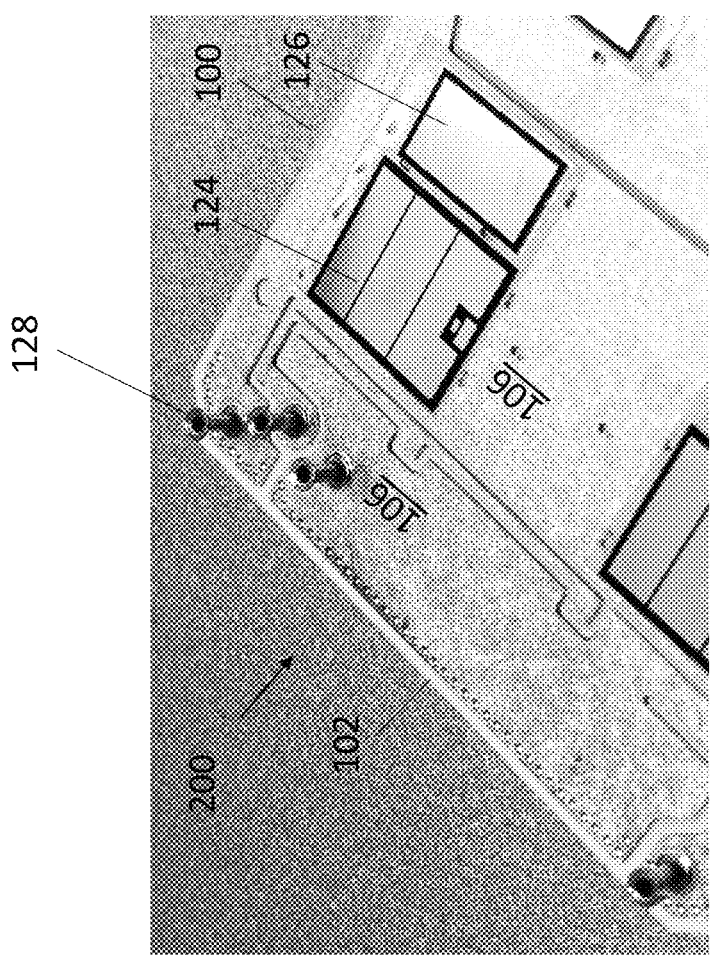
FIG. 4 illustrates a power module substrate assembly including with soldered joints that may be formed by a pre-plating technique, according to an embodiment.
Figure 5:
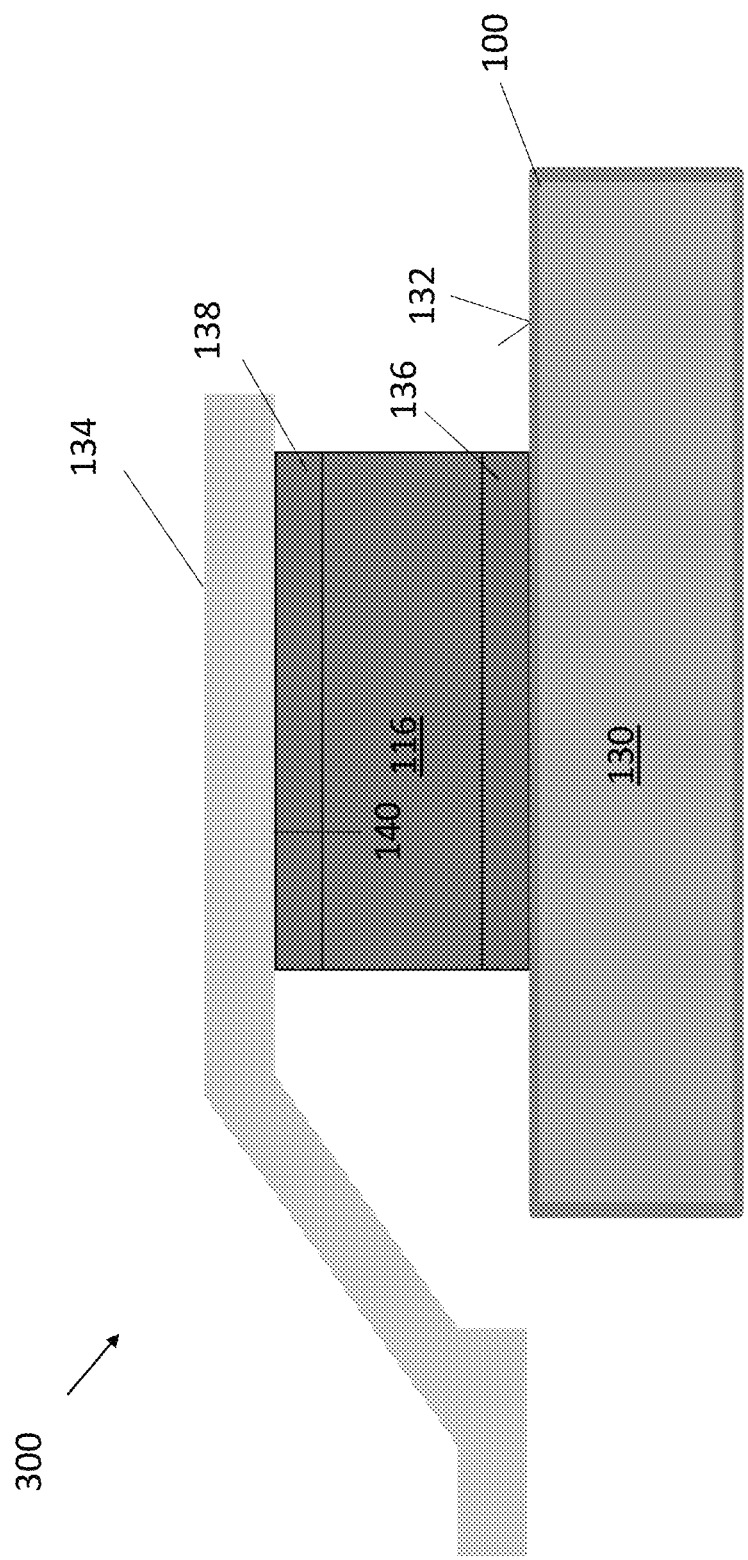
FIG. 5 illustrates a lead frame assembly including with soldered joints that may be formed by a pre-plating technique, according to an embodiment.

Referring to FIG. 4, a power module assembly 200 is depicted, according to an embodiment. The power module assembly 200 includes substrate 100 with a plurality of bond pads 106 disposed on a dielectric layer 102. The substrate 100 is configured as a direct bonded copper (DBC) substrate, wherein the bond pads 106 comprise Cu or a Cu alloy and the dielectric layer 102 comprises ceramic. Several different joining partners are soldered to the bond pads 106. Specifically, first and second semiconductor dies 124, 126 are soldered to a first one of the bond pads 106 and a mechanical connector 128 is soldered to a second one of the bond pads 106. In an embodiment, the first semiconductor die 124 is a power transistor, e.g., MOSFET, IGBT, HEMT, etc., the second semiconductor die 126 is a gate driver configured to provide a gate signal for driving the first semiconductor die 124, and the mechanical connector 128 is a pin-rivet that is dimensioned to insertably receive a corresponding structure, e.g. a press-fit connector.

According to an embodiment, at least some of the soldered connections between in the power module assembly 200 are provided by pre-plating the substrate 100. For example, the portions of the first bond pads 106 which accommodate the first and second semiconductor dies 124, 126 may be pre-plated with the plated solder regions 114 according to the technique described with reference to FIG. 1. Subsequently, the first and second semiconductor dies 124, 126 may be arranged on the plated solder regions 114 and soldered to the substrate 100 according to the technique described with reference to FIG. 2.

Optionally, the soldered connections between the mechanical connectors 128 and the substrate 100 may be provided by pre-plating the substrate 100 as well. In that case, the portions of the second bond pads 106 which accommodate the mechanical connector 128 may be pre-plated with the plated solder regions 114 according to the technique described with reference to FIG. 1. Subsequently, the mechanical connectors 128 may be arranged on the plated solder regions 114 and soldered to the substrate 100 according to the technique described with reference to FIG. 2. The plating step and the diffusion soldering step for the mechanical connectors 128 and the first and second semiconductor dies 124, 126 may be performed simultaneously such that these soldered connections are formed at the same time. In one embodiment of that technique, the plated solder regions 114 that form the soldered joints for the mechanical connectors 128 may have a different thickness as the plated solder regions 114 that form the soldered joints for the first and second semiconductor dies 124, 126. By adjusting the thickness of the plated solder regions 114, the amount of intermetallic phases 122 present with the soldered joints may be adjusted. Consequently, a trade-off between ductility and tensile strength in these soldered joints may be adjusted. The plated solder regions 114 used to form the soldered joints for the mechanical connectors 128 may have a thickness of at least 30 μm, at least 50 μm, or greater to form soldered joints with higher ductility. The plated solder regions 114 used to form the first and second semiconductor dies 124, 126 may have a thickness at most 15 μm, at most 12 μm, at most 10 μm, etc., to form soldered joints with higher tensile strength.

Alternatively, the soldered connections between the mechanical connectors 128 and the substrate 100 may be provided by a separate soldering process. This separate soldering process may involve conventional soldering techniques, e.g. by applying a solder paste and reflowing the solder paste. This separate soldering step can be performed at a temperature that is sufficient to reflow the solder for the mechanical connectors 128 but below the melting point of the intermetallic phases 122 present with the soldered joints.

According to another embodiment, at least some of the soldered joints may be provided by pre-plating the joining partners that are soldered to the substrate 100. For example, the technique described with reference to FIG. 1 may be performed on a semiconductor wafer, with the die metallization from each die site corresponding to the first metal joining surface 108. After forming the plated solder regions 114, the die sites can be singulated into individual semiconductor dies. Subsequently, the pre-plated semiconductor dies (e.g., first semiconductor die 124 and/or the second semiconductor die 126) may be placed on the substrate 100 and soldered to the bond pads 106 according to the technique described with reference to FIG. 2. Correspondingly, the mechanical connectors 128 may be pre-plated with the plated solder regions 114 using the same technique.

Referring to FIG. 4, a lead-frame assembly 300 is depicted. The lead-frame assembly 300 is used to form a packaged semiconductor device. To this end, the lead-frame assembly 300 includes a die pad 130 with a die attach surface 132 that accommodates at least one of the semiconductor dies 116 thereon. The lead-frame assembly 300 additionally includes a number of electrically conductive leads (not shown) which form individual terminals of the packaged device. These electrically conductive leads are electrically connected to the terminals of the semiconductor die by electrical connectors. In the depicted embodiment, one of these electrical connectors is configured as a metal clip 134 which forms an electrical connection with an upper surface of the semiconductor die 116. Alternatively, these electrical connections can be provided using other connectors such as bond wires or ribbons. An electrically insulating mold compound (not shown) can be formed around the lead-frame assembly 300 to encapsulate the semiconductor dies 116 and corresponding electrical connections.

The lead-frame assembly 300 includes a first soldered joint 136 between a lower surface of the semiconductor die 116 and the die attach surface 132 of the die pad 130. The first soldered joint 136 may provide an electrical connection between a lower surface terminal (e.g., drain, source, etc.) and the die pad 130. In another embodiment, the first soldered joint 136 provides a purely mechanical connection. The lead-frame assembly 300 additionally includes a second soldered joint 138 between an upper surface of the semiconductor die and a die attach surface 140 of the metal clip 134. The second soldered joint 138 may provide a second electrical connection between an upper surface terminal of the semiconductor die (e.g., drain, source, etc.) and the metal clip 134.

One or both of the first and second soldered joints 136, 138 may be formed by pre-plating the joining partners (in this case the die pad 130, the semiconductor die 116 and the metal clip 134) according to the technique described with reference to FIG. 1. In an embodiment, the semiconductor die 116 is pre-plated. For example, the technique described with reference to FIG. 1 may be performed on a semiconductor wafer, with the die metallization from each die site corresponding to the first metal joining surface 108. The die metallization may be a front side metallization, a rear side metallization, or both. After forming the plated solder regions 114, the die sites can be singulated into individual semiconductor dies 116. Subsequently, the pre-plated semiconductor dies 116 may be placed on the die pad 130 and soldered to one or both of the die pad 130 and the metal clip 134 according to the technique described with reference to FIG. 2. In another embodiment, the lead-frame is pre-plated. For example, the technique described with reference to FIG. 1 may be performed on a lead frame or multiple lead frames in strip or panel form, wherein the die attach surface 132 of the die pad 130 corresponds to the first metal joining surface 108. Subsequently, the semiconductor die 116 may be placed on the pre-plated lead frame and soldered to the lead frame according to the technique described with reference to FIG. 2. In yet another embodiment, the metal clip 134 is pre-plated. For example, the technique described with reference to FIG. 1 may be performed on a metal clip or plurality of metal clips in unit or panel form, wherein the die attach surface 140 of the metal clip 134 to the first metal joining surface 108. After the mounting of the semiconductor die 116 on the die pad 130, the pre-plated metal clip 134 may be arranged on the semiconductor die 116 and soldered to the semiconductor die 116 according to the technique described with reference to FIG. 2.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method of forming a pre-soldered element, the method comprising:
providing a substrate comprising a first metal joining surface;
depositing a mask material on the substrate that covers the first metal joining surface;
patterning the mask material to form an opening that exposes the first metal joining surface; and
performing a plating process that forms a plated solder region on a portion of the first metal joining surface that is exposed by the opening;
wherein the substrate is a carrier that is any one of: a direct bonded copper substrate, an active metal brazed substrate, or an insulated metal substrate,
wherein the plated solder region has a lower melting point than the first metal joining surface, and
wherein the plated solder region forms one or more intermetallic phases with the first metal joining surface at a soldering temperature that is above the melting point of the plated solder region.

2. The method of claim 1, wherein a maximum thickness of the plated solder region is at most 50 μm.

3. The method of claim 2, wherein the maximum thickness of the plated solder region is between 5 μm and 30 μm.

4. The method of claim 1, wherein the plating process comprises electroless plating.

5. The method of claim 1, wherein the substrate comprises a ceramic dielectric layer and a metal layer attached to the dielectric layer, the metal layer comprising one or more bond pads, and wherein the first metal joining surface is from one of the one or more bond pads.

6. The method of claim 5, wherein the metal layer comprises a plurality of the bond pads, wherein depositing the mask material comprises covering the bond pads and filling gaps between the bond pads with the mask material, and wherein patterning the mask material comprises forming the opening to partially expose an upper surface area of a first one of the bond pads.

7. A method of forming a pre-soldered element, the method comprising:
providing a substrate comprising a first metal joining surface;
depositing a mask material on the substrate that covers the first metal joining surface;
patterning the mask material to form an opening that exposes the first metal joining surface; and
performing a plating process that forms a plated solder region on a portion of the first metal joining surface that is exposed by the opening;
wherein the substrate is a leadframe or a metal clip, and wherein the first metal joining surface is a die attach surface of the leadframe or the metal clip,
wherein the plated solder region has a lower melting point than the first metal joining surface, and
wherein the plated solder region forms one or more intermetallic phases with the first metal joining surface at a soldering temperature that is above the melting point of the plated solder region.

* * * * *